(12) United States Patent
Sagawa

(10) Patent No.: US 9,130,190 B2
(45) Date of Patent: Sep. 8, 2015

(54) DISPLAY AND METHOD OF MANUFACTURING THE SAME

(71) Applicant: Sony Corporation, Tokyo (JP)

(72) Inventor: Hiroshi Sagawa, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/243,995

(22) Filed: Apr. 3, 2014

(65) Prior Publication Data

US 2014/0209889 A1    Jul. 31, 2014

Related U.S. Application Data

(63) Continuation of application No. 12/730,548, filed on Mar. 24, 2010, now Pat. No. 8,766,285.

(30) Foreign Application Priority Data

Apr. 3, 2009   (JP) ................................. 2009-091292

(51) Int. Cl.
    *H01L 51/52*    (2006.01)
(52) U.S. Cl.
    CPC ........ *H01L 51/5203* (2013.01); *H01L 51/5221* (2013.01)
(58) Field of Classification Search
    CPC ....................................................... H01L 51/52
    USPC .............. 257/88, 83, 98, 99, 72, 84; 313/506, 313/504
    See application file for complete search history.

(56) References Cited

U.S. PATENT DOCUMENTS

| 5,187,604 A * | 2/1993 | Taniguchi et al. ............ 349/152 |
| 6,628,361 B2 | 9/2003 | Takahashi et al. |
| 7,154,218 B2 | 12/2006 | Murakami et al. |
| 8,004,180 B2 | 8/2011 | Seo |
| 2003/0227021 A1 | 12/2003 | Yamazaki et al. |
| 2005/0186359 A1* | 8/2005 | Ishizuka et al. ................ 428/1.1 |
| 2006/0125390 A1* | 6/2006 | Oh ................................ 313/506 |
| 2007/0190887 A1 | 8/2007 | Sato et al. |
| 2007/0235767 A1 | 10/2007 | Lee |
| 2008/0136989 A1 | 6/2008 | Higaki et al. |
| 2009/0066236 A1* | 3/2009 | Sung et al. .................... 313/504 |

FOREIGN PATENT DOCUMENTS

| JP | 06-104241 | 4/1994 |
| JP | 2004-207217 | 7/2004 |
| JP | 2006-113571 | 4/2006 |

(Continued)

*Primary Examiner* — Sheng Zhu
(74) *Attorney, Agent, or Firm* — Dentons US LLP

(57) ABSTRACT

A display includes: a light-emitting element formed by laminating a first electrode layer, an organic layer including a light-emitting layer and a second electrode layer in order on a base; and an auxiliary wiring layer being arranged so as to surround the organic layer and being electrically connected to the second electrode layer, in which the auxiliary wiring layer includes a two-layer configuration including a first conductive layer and a second conductive layer, the first conductive layer has lower contact resistance to the second electrode layer than that of the second conductive layer, the two-layer configuration in the auxiliary wiring layer is formed so that an end surface of the second conductive layer is recessed inward from an end surface of the first conductive layer, thereby a part of a top surface of the first conductive layer is in contact with the second electrode layer.

4 Claims, 10 Drawing Sheets

(56) References Cited

FOREIGN PATENT DOCUMENTS

| JP | 2008-134647 | 6/2008 |
| JP | 2008-300260 | 12/2008 |
| JP | 2009-063643 | 3/2009 |
| WO | WO/01/39554 | 5/2001 |
| WO | WO/2007/148540 | 12/2007 |

* cited by examiner

DISPLAY AND METHOD OF MANUFACTURING THE SAME

RELATED APPLICATION DATA

This application is a continuation of U.S. patent application Ser. No. 12/730,548 filed Mar. 24, 2010, the entirety of which is incorporated herein by reference to the extent permitted by law. The present application claims the benefit of priority to Japanese Patent Application No. JP 2009-091292 filed on Apr. 3, 2009 in the Japan Patent Office, the entirety of which is incorporated by reference herein to the extent permitted by law.

BACKGROUND OF THE INVENTION

1. Field of the Invention

The present invention relates to a display including a self-luminous type light-emitting element which includes an organic layer, and a method of manufacturing the same.

2. Description of the Related Art

In recent years, as displays replacing liquid crystal displays, organic EL (Electro Luminescence) displays using a self-luminous type organic EL element which includes an organic layer have been put into practical use. The organic EL display are of a self-luminous type, so compared to liquid crystal displays, the organic EL displays have a wide viewing angle, and adequate response to high-definition high-speed video signals.

A resonator configuration is introduced into an organic EL element in related art, thereby an attempt to improve display performance has been made by controlling light generated in a light-emitting layer such as improving color purity of an emitted color or improving light emission efficiency as described in, for example, International Publication No. 01/39554. For example, in a top emission system in which light is extracted from a surface (a top surface) opposite to a substrate, an anode electrode, an organic layer and a cathode electrode are laminated in order on the substrate with a driving transistor in between, and light from the organic layer is multiply reflected between the anode electrode and the cathode electrode.

In a top emission system organic EL display, to secure a high aperture ratio, a cathode electrode located on a sealing panel side is one electrode layer commonly arranged for organic EL elements. Moreover, the cathode electrode is made of, for example, a light transmissive conductive material such as ITO (Indium Tin Oxide) so as to extract light from a top surface. However, such a light transmissive conductive material has a few orders of magnitude higher resistance than a typically used metal material. Therefore, a voltage applied to the cathode electrode easily becomes nonuniform in a plane, so there is an issue that variations in light emission luminance among organic EL elements in an in-plane position occur, thereby it is difficult to obtain sufficient display quality.

Therefore, to solve such an issue, for example, as described in Japanese Unexamined Patent Application Publication No. 2004-207217, there is proposed an organic EL display in which an auxiliary wire connected to the cathode electrode is formed of a layer shared with, for example, the anode electrode located on a drive panel side so as to prevent a voltage drop in an in-plane direction of the cathode electrode. The auxiliary wire is connected to the cathode electrode, for example, outside a display region of each organic EL element. Thus, the auxiliary wire is arranged in a mesh form along the cathode electrode spreading in an in-plane direction, and is connected to the cathode electrode, thereby variations in light emission luminance among organic EL elements in the above-described in-plane position are reduced to some extent.

In the case where the organic EL display having the above-described auxiliary wire is formed, to simplify manufacturing steps, for example, it is desirable to collectively form the anode electrode and the auxiliary wire using a common material. As a material of the anode electrode, a simple substance or a compound of aluminum having high reflectivity is most preferable. However, in the case where such a material is used to form an auxiliary electrode, oxidation of a surface of the auxiliary electrode during the manufacturing steps is an issue. More specifically, when the surface of the auxiliary electrode is oxidized, connection resistance between the auxiliary electrode and the cathode electrode is increased, thereby to cause a large voltage drop in a connection part between the auxiliary electrode and the cathode electrode. Therefore, nonuniformity of a light emission luminance distribution in a display screen may not be reduced sufficiently.

To solve such an issue, for example, as described in International Publication No. 2007/148540, the applicant of the present invention has proposed an organic EL display in which a conductive contact section is formed in advance, and then an anode electrode and an auxiliary wire, and a cathode electrode are formed in order so as to be in contact with the contact section.

SUMMARY OF THE INVENTION

In International Publication No. 2007/148540, even if an anode electrode and an auxiliary wire are formed of an easily-oxidizable material such as aluminum, good conductivity is obtained through a contact section.

However, in International Publication No. 2007/148540, it is necessary to provide a sufficient space for arranging the contact section. In International Publication No. 2007/148540, the contact section is arranged at the same level as a level where a drive element which drives an organic EL element to display is arranged. However, when an attempt to improve pixel density is made, a short circuit between the contact section and another conductive layer such as an electrode layer in the drive element may occur.

It is desirable to provide a display allowed to deliver superior display performance while having high reliability, and a method of manufacturing the display.

According to an embodiment of the invention, there is provided a display including: a light-emitting element formed by laminating a first electrode layer, an organic layer including a light-emitting layer and a second electrode layer in order on a base; and an auxiliary wiring layer being arranged so as to surround the organic layer and being electrically connected to the second electrode layer. In this case, the auxiliary wiring layer includes a two-layer configuration including a first conductive layer and a second conductive layer, and the first conductive layer has lower contact resistance to the second electrode layer than the second conductive layer. Moreover, the two-layer configuration in the auxiliary wiring layer is formed so that an end surface of the second conductive layer is recessed inward from an end surface of the first conductive layer, thereby a part of a top surface of the first conductive layer is in contact with the second electrode layer.

According to an embodiment of the invention, there is provided a method of manufacturing a display, the display being the display according to the embodiment of the invention, the method including the steps of: forming a laminate film by laminating a first conductive layer and a second conductive layer on the base, the second conductive layer having higher contact resistance to the second electrode layer than the first conductive layer; forming a laminate film pattern by patterning the laminate film in a predetermined shape; and forming the auxiliary wiring layer by etching the laminate film pattern using an etching solution having higher solubility in the second conductive layer than in the first conductive layer so as to recess an end surface of the second conductive layer and to expose a part of a top surface of the first conductive layer.

In the display and the method of manufacturing a display according to the embodiment of the invention, an end section of the two-layer configuration in the auxiliary wiring layer has a step-like shape, so a part of a film surface (a top surface) of the first conductive layer having lower contact resistance to the second electrode layer than the second conductive layer is in contact with the second electrode layer. Therefore, even if the second conductive layer is formed of a material which is prone to surface oxidation such as aluminum, favorable contact between the auxiliary wiring layer and the second electrode layer is secured without influence of surface oxidation.

In the display and the method of manufacturing a display according to the embodiment, the auxiliary wiring layer electrically connected to the second electrode layer in the light-emitting element has a two-layer configuration including the first conductive layer and the second conductive layer, and a part of a top surface of the first conductive layer having lower contact resistance to the second electrode layer than the second conductive layer is in contact with the second electrode layer, so without influence of the material of the second conductive layer, favorable contact between the auxiliary wiring layer and the second electrode layer is achievable. As a result, uniformity of a light emission luminance distribution in a display screen is allowed to be improved, and higher display performance is obtainable.

Other and further objects, features and advantages of the invention will appear more fully from the following description.

DETAILED DESCRIPTION OF THE PREFERRED EMBODIMENTS

A preferred embodiment will be described in detail below referring to the accompanying drawings.

Figure 1:
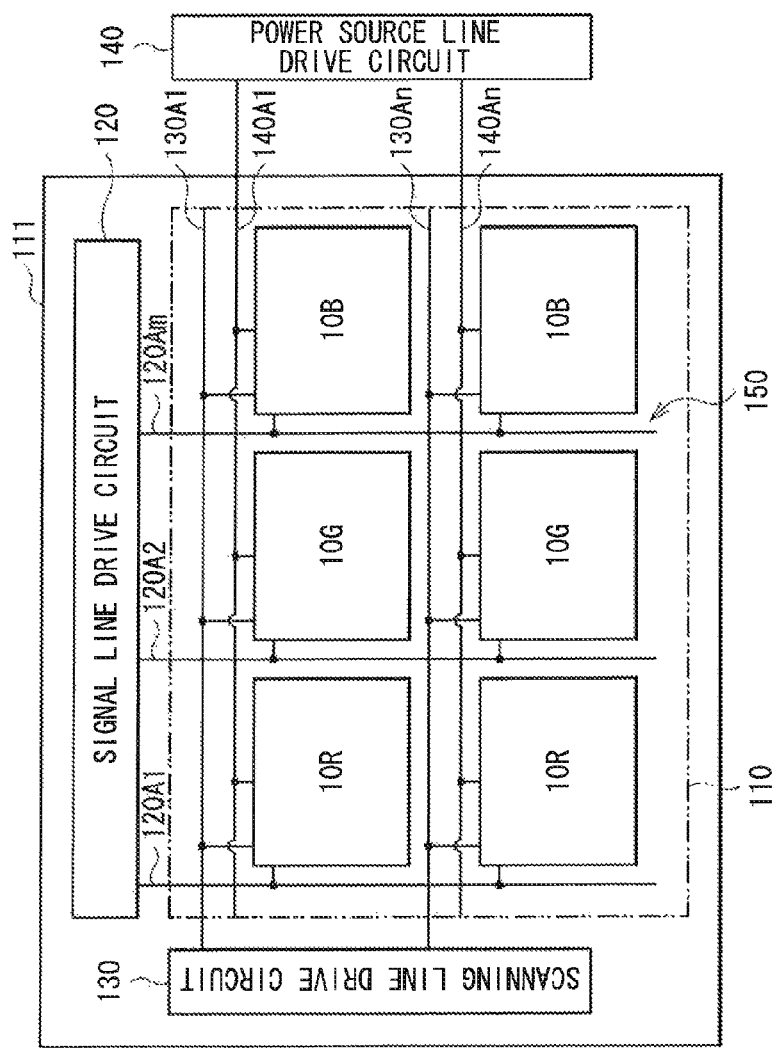
FIG. 1 is an illustration of a configuration of a display according to an embodiment of the invention.

FIG. 1 illustrates a configuration of a display using an organic light-emitting element according to an embodiment of the invention. The display is used as an ultrathin organic light-emitting color display or the like. The display is configured by forming a display region 110 on a substrate 111. For example, a signal line drive circuit 120, a scanning line drive circuit 130 and a power source line drive circuit 140 as drivers for picture display are formed around the display region 110 on the substrate 111.

In the display region 110, a plurality of organic light-emitting elements 10 (10R, 10G and 10B) two-dimensionally arranged in a matrix form, and a pixel drive circuit 150 for driving the organic light-emitting elements 10 are formed. In the pixel drive circuit 150, a plurality of signal lines 120A (120A1, 120A2, ..., 120Am, ...) are arranged in a column direction, and a plurality of scanning lines 130A (130A1, ..., 130An, ...) and a plurality of power source lines 140A (140A1, ..., 140An, ...) are arranged in a row direction. One of the organic light-emitting elements 10R, 10G and 10B is arranged at each intersection between the signal lines 120A and the scanning lines 130A. Each of the signal lines 120A is connected to the signal line drive circuit 120, and each of the scanning lines 130A is connected to the scanning line drive circuit 130, and each of the power source lines 140A is connected to the power source line drive circuit 140.

The signal line drive circuit 120 supplies a signal voltage of a picture signal according to luminance information supplied from a signal supply source (not illustrated) to selected organic light-emitting elements 10R, 10G and 10B through the signal lines 120A.

The scanning line drive circuit 130 is configured of a shift register or the like which sequentially shifts (transfers) start pulses in synchronization with inputted clock pulses. When picture signals are written to the organic light-emitting elements 10R, 10G and 10B, the scanning line drive circuit 130 scans the picture signals on a line-by-line basis so as to sequentially supply scanning signals to the scanning lines 130A.

The power source line drive circuit 140 is configured of a shift register or the like which sequentially shifts (transfers) start pulses in synchronization with inputted clock pulses. The power source line drive circuit 140 appropriately supplies one of a first potential and a second potential which are different from each other to each power source line 140A in synchronization with scanning on a line-by-line basis by the scanning line drive circuit 130. Thereby, switching between a conduction state and a non-conduction state of a driving transistor Tr1 which will be described later is performed.

Figure 2:
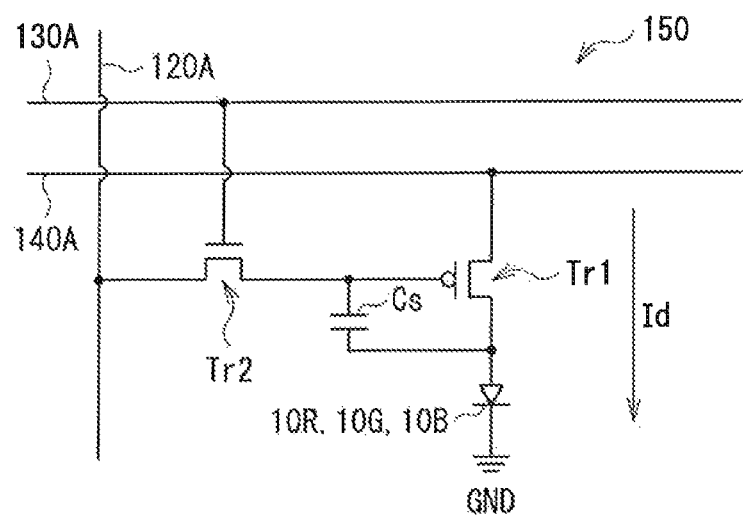
FIG. 2 is an illustration of an example of a pixel drive circuit illustrated in FIG. 1.

The pixel drive circuit 150 is arranged at a level (a pixel drive circuit forming layer 112 which will be described later) between the substrate 111 and the organic light-emitting element 10. FIG. 2 illustrates a configuration example of the pixel drive circuit 150. As illustrated in FIG. 2, the pixel drive circuit 150 is an active drive circuit including the driving transistor Tr1 and a writing transistor Tr2, a capacitor (retention capacitor) Cs between the driving transistor Tr1 and the writing transistor Tr2, and the organic light-emitting element 10. The organic light-emitting element 10 is connected to the driving transistor Tr1 in series between the power source line 140A and a common power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the writing transistor Tr2, for example, a drain electrode is connected to the signal line 120A so as to supply a picture signal from the signal line drive circuit 120. Moreover, a gate electrode of the writing transistor Tr2 is connected to the scanning line 130A so as to supply a scanning signal from the scanning line drive circuit 130. Moreover, a source electrode of the writing transistor Tr2 is connected to a gate electrode of the driving transistor Tr1.

In the driving transistor Tr1, for example, a drain electrode is connected to the power source line 140A, and the potential of the driving transistor Tr1 is set to one of the first potential and the second potential by the power source line drive circuit 140. A source electrode of the driving transistor Tr1 is connected to the organic light-emitting element 10.

The retention capacitor Cs is formed between the gate electrode of the driving transistor Tr1 (the source electrode of the writing transistor Tr2) and the source electrode of the driving transistor Tr1.

Figure 3:
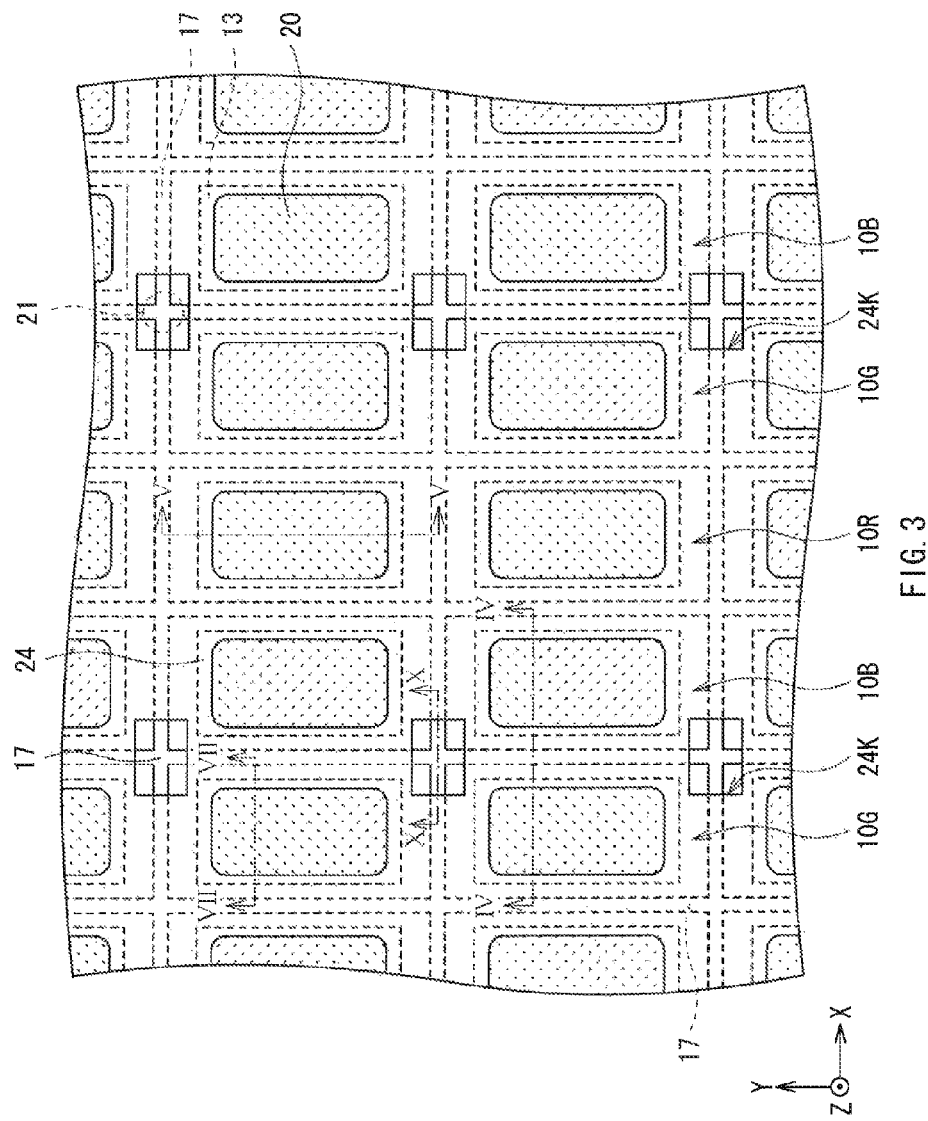
FIG. 3 is a plan view illustrating a configuration of a display region illustrated in FIG. 1.

FIG. 3 illustrates a configuration example of the display region 110 spreading in an XY plane. In this case, FIG. 3 illustrates a planar configuration of the display region 110 without a second electrode layer 16, a protective film 18 and a sealing substrate 19 (all of which will be described later) when viewed from above. In the whole display region 110, a plurality of organic light-emitting elements 10 are arranged in a matrix form. More specifically, a metal layer 17 as an auxiliary wiring layer is arranged in a grid form, and one of the organic light-emitting elements 10R, the organic light-emitting elements 10G and the organic light-emitting elements 10B each including a light emission region 20 of which the outline is specified by an opening specifying insulating film 24 is arranged in each region divided by the metal layer 17. The organic light-emitting element 10R emits red light, and the organic light-emitting element 10G emits green light, and the organic light-emitting element 10B emits blue light. In this case, the organic light-emitting elements 10 emitting the same color light are arranged in lines in a Y direction, and the lines including the organic light-emitting elements 10 emitting the same color light are arranged in an X direction repeatedly and sequentially. Therefore, the organic light-emitting elements 10R, 10G and 10B which are adjacent to one another in the X direction constitute to one pixel. In FIG. 3, a rectangular region indicated by a broken line in each region divided by the metal layer 17 is a first electrode layer 13 (which will be described later) included in the organic light-emitting element 10. Moreover, openings 24K are arranged in the opening specifying insulating film 24 at some intersections of the metal layer 17. In a region included in the opening 24K, a connection section 21 (a part surrounded by a broken line) for connecting between the metal layer 17 and the second electrode layer 16 of the organic light-emitting element 10 is arranged. In addition, in FIG. 3, 2 in a row direction×5 in a column direction=10 organic light-emitting elements in total are illustrated, but the number of organic light-emitting elements arranged in the X direction and the Y direction is not limited thereto.

Figure 4:
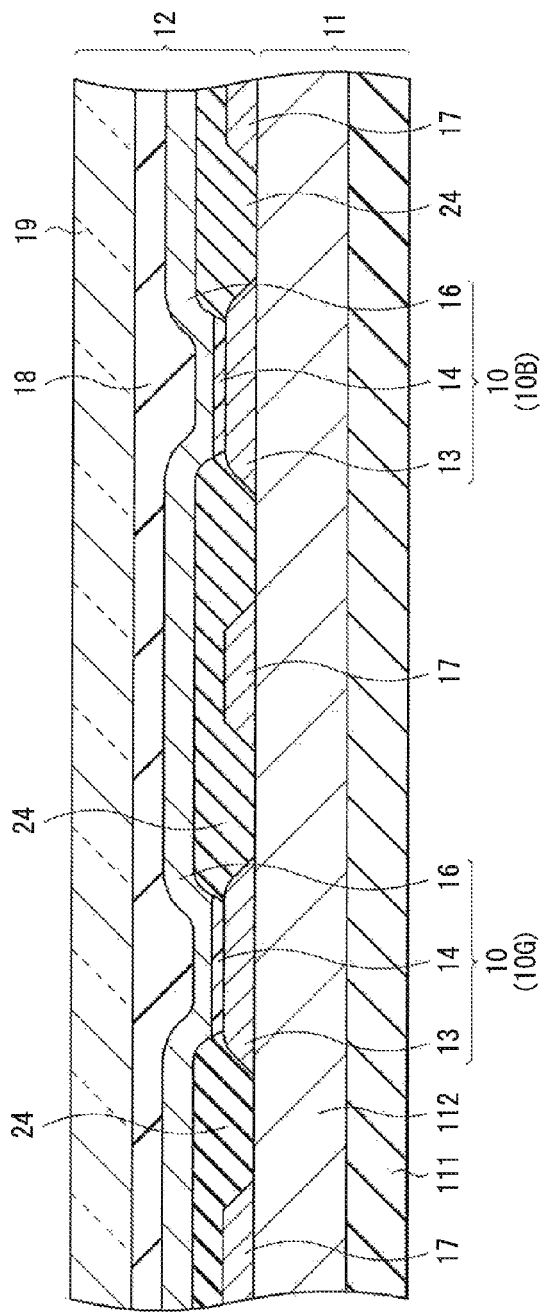
FIG. 4 is a sectional view illustrating a configuration of the display region illustrated in FIG. 1.

FIG. 4 illustrates a schematic configuration of an XZ section taken along a line IV-IV of FIG. 3. As illustrated in FIG. 4, in the display region 110, a light-emitting element forming layer 12 including the organic light-emitting elements 10 is formed on a base 11 formed by arranging a pixel drive circuit forming layer 112 on a substrate 111. On the organic light-emitting elements 10, a protective film 18 and a sealing substrate 19 are arranged in order. Each of the organic light-emitting elements 10 is formed by laminating a first electrode layer 13 as an anode electrode, an organic layer 14 including a light-emitting layer 14C (which will be described later) and a second electrode layer 16 as a cathode electrode in order from the substrate 111. The organic layer 14 and the first electrode layer 13 of one organic light-emitting element 10 are separated from the organic layer 14 and the first electrode layer 13 of another organic light-emitting element 10 by the opening specifying insulating film 24. On the other hand, the second electrode layer 16 is commonly arranged for all organic light-emitting elements 10. The metal layer 17 is buried in the opening specifying insulating film 24 except for regions corresponding to the openings 24K. In addition, in FIG. 4, specific configurations of the driving transistor Tr1, the writing transistor Tr2 and the like in the pixel drive circuit forming layer 112 are not illustrated.

The opening specifying insulating film 24 is arranged so as to fill in gaps between the first electrode layers 13 and the organic layers 14 of adjacent organic light-emitting elements. The opening specifying insulating film 24 is made of, for example, an organic material such as polyimide, and secures insulation between the first electrode layer 13, and the second electrode layer 16 and the metal layer 17, and accurately forms light emission regions of the organic light-emitting elements 10 into a desired shape.

The protective film 18 covering the organic light-emitting elements 10 is made of an insulating material such as silicon nitride (SiNx). Moreover, the sealing substrate 19 arranged on the protective film 18 seals the organic light-emitting elements 10 together with the protective film 18, an adhesive layer (not illustrated) or the like, and is made of a material allowing light generated in the light-emitting layer 14C to pass therethrough such as transparent glass.

Next, referring to FIGS. 5 to 10, specific configurations of the base 11 and the organic light-emitting elements 10 will be described below. In addition, the organic light-emitting elements 10R, 10G and 10B have a common configuration except that the configurations of the organic layers 14 in the organic light-emitting elements 10R, 10G and 10B are partially different from one another, so the organic light-emitting elements 10R, 10G and 10B will be collectively described below.

Figure 5:
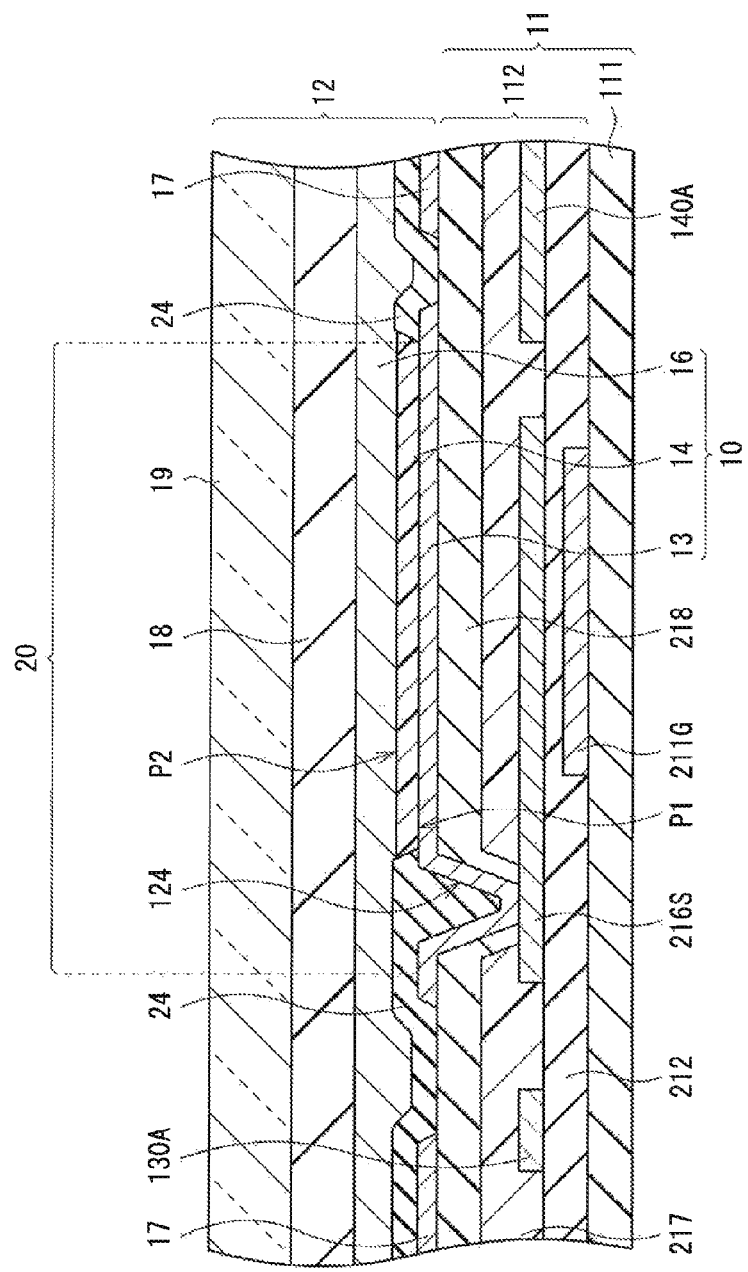
FIG. 5 is a sectional view illustrating a configuration of an organic light-emitting element illustrated in FIG. 3.
Figure 6:
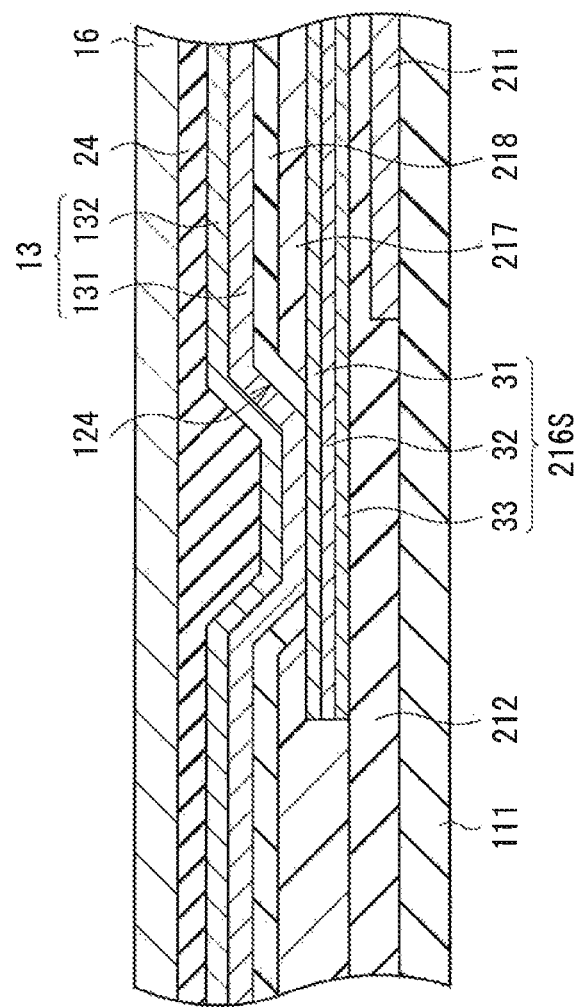
FIG. 6 is an enlarged sectional view illustrating a main part of FIG. 5.
Figure 7:
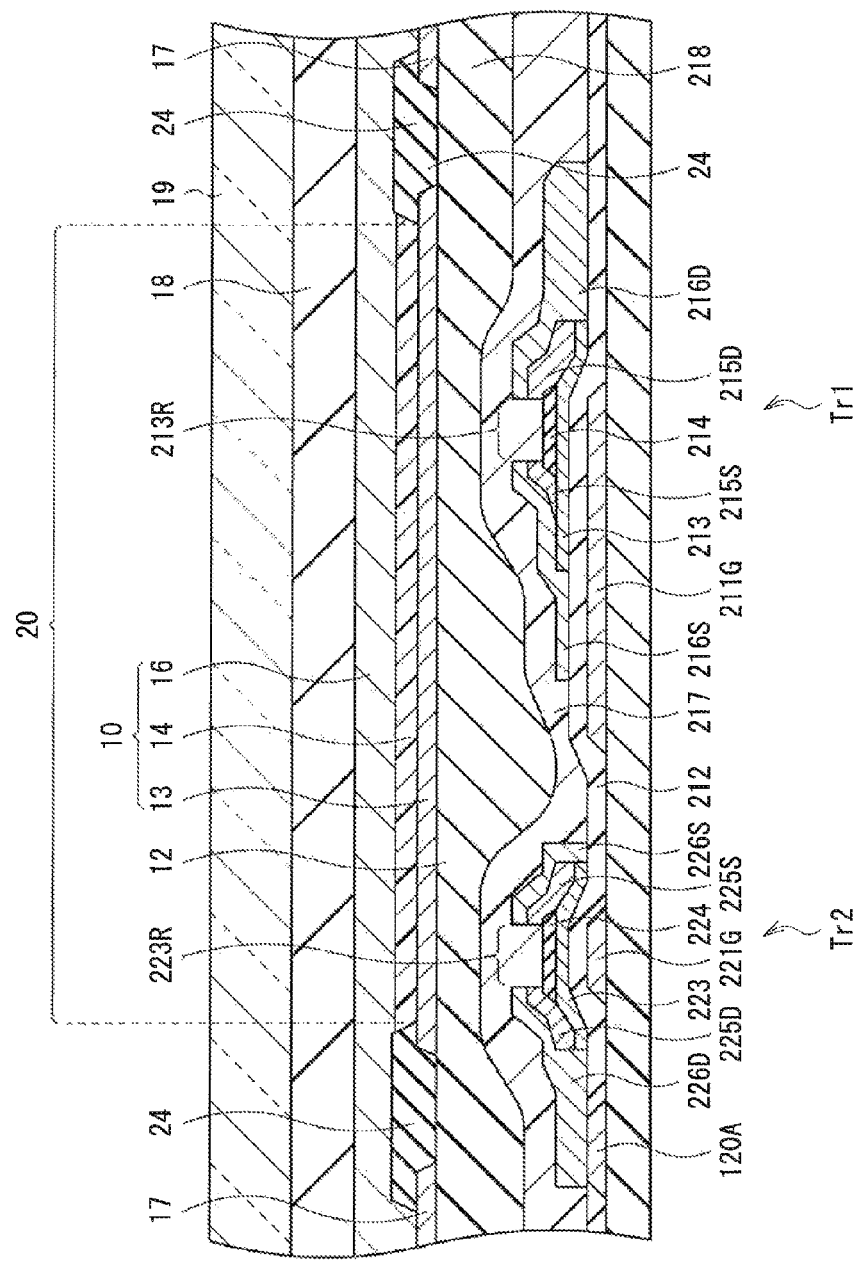
FIG. 7 is another sectional view illustrating the configuration of the organic light-emitting element illustrated in FIG. 3.
Figure 8:
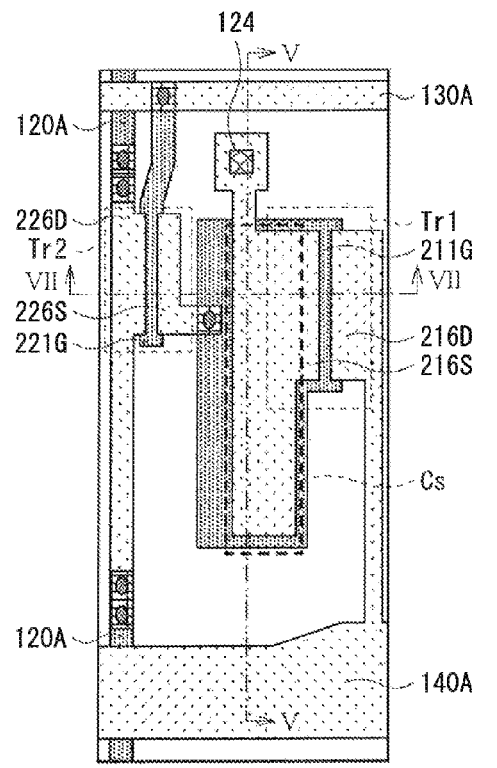
FIG. 8 is a plan view illustrating a configuration of a pixel drive circuit forming layer illustrated in FIGS. 5 and 7.
Figure 9:
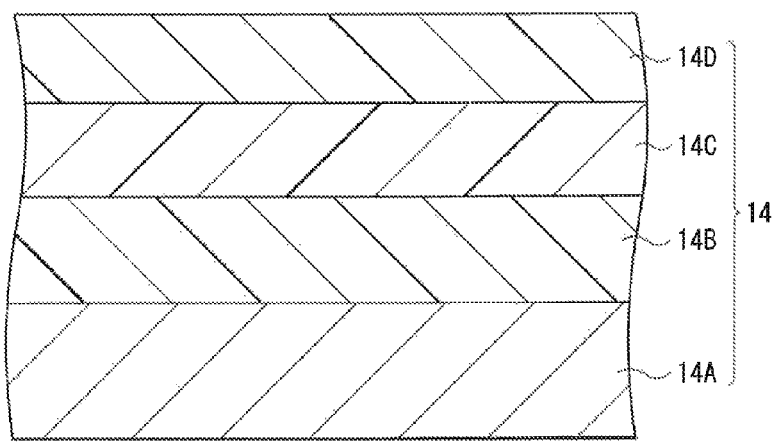
FIG. 9 is an enlarged sectional view illustrating an organic layer illustrated in FIG. 5.
Figure 10:
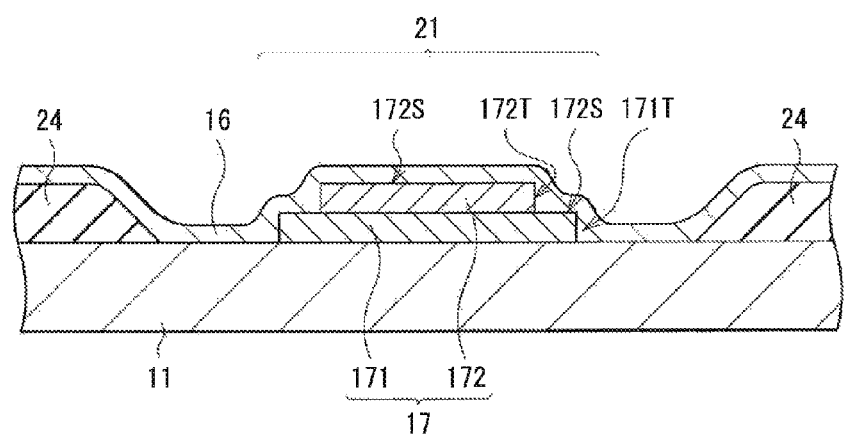
FIG. 10 is an enlarged sectional view of a connection section illustrated in FIG. 3.

FIG. 5 is a sectional view of the display region 110 taken along a line V-V of FIG. 3, and FIG. 6 is an enlarged sectional view illustrating a part in proximity to a connection hole 124 illustrated in FIG. 5. Moreover, FIG. 7 is a sectional view taken along a line VII-VII of FIG. 3. Further, FIG. 8 is schematic view illustrating a planar configuration of the pixel drive circuit 150 arranged in the pixel drive circuit forming layer 112 in one organic light-emitting element 10. In addition, FIG. 5 corresponds to a section taken along a line V-V of FIG. 8, and FIG. 7 corresponds to a section taken along a line VII-VII of FIG. 8. Moreover, FIG. 9 illustrates an enlarged sectional view of a part of the organic layer 14 illustrated in FIGS. 4, 5 and 7. Further, FIG. 10 illustrates an enlarged view of a configuration of an XZ section in proximity to the connection section 21 taken along a line X-X of FIG. 3.

The base 11 is formed by arranging the pixel drive circuit forming layer 112 including the pixel drive circuit 150 on the substrate 111 made of glass, a silicon (Si) wafer, a resin or the like. On a surface of the substrate 111, a metal layer 211G as a gate electrode of the driving transistor Tr1, a metal layer 221G as a gate electrode of the writing transistor Tr2 and the signal line 120A (refer to FIGS. 7 and 8) are arranged as metal layers at a first level. The metal layers 211G and 221G and the signal line 120A are covered with a gate insulating film 212 made of silicon nitride, silicon oxide or the like. Channel layers 213 and 223 configured of semiconductor thin films of amorphous silicon or the like are arranged in regions corresponding to the metal layers 211G and 221G on the gate insulating film 212, respectively. Insulating channel protective films 214 and 224 are arranged on the channel layers 213 and 223 so as to fill in channel regions 213R and 223R as central regions of the channel layers 213 and 223, respectively, and drain electrodes 215D and 225D and source electrodes 215S and 225S all of which are configured of n-type semiconductor thin films of n-type amorphous silicon or the like are arranged in regions on both sides of the central regions. The drain electrode 215D and the source electrode 215S are separated from each other by the channel protective film 214, and the drain electrode 225D and the source electrode 225S are separated from each other by the channel protective film 224, and end surfaces of the drain electrode 215D and the source electrode 215S are separated from each other with the channel regions 213R in between, and end surfaces of the drain electrode 225D and the source electrode 225S are separated from each other with the channel region 223R in between. Moreover, metal layers 216D and 226D as drain wires and metal layers 216S and 226S as source wires are arranged as metal layers at a second level so as to cover the drain electrodes 215D and 225D and the source electrodes 215S and 225S, respectively. The metal layers 216D and 226D and the metal layers 216S and 226S each have, for example, a configuration in which a titanium (Ti) layer, an aluminum (Al) layer and a titanium layer are laminated in order. As the metal layers at the second level, in addition to the above-described metal layers 216D and 226D and the above-described metal layers 216S and 226S, the scanning line 130A and the power source line 140A (refer to FIGS. 5 and 8) are arranged. In addition, in this case, the driving transistor Tr1 and the writing transistor Tr2 having an inverted stagger configuration (a so-called bottom gate type) are described. However, they may have a stagger configuration (a so-called top gate type). Moreover, the signal line 120A may be arranged at the second level in a region except for intersections with the scanning line 130A and the power source line 140A.

For example, the metal layers at the second level preferably have a three-layer configuration including first to third thin layers 31 to 33 laminated in order from the organic light-emitting element 10 (the first electrode layer 13) as in the case of the metal layer 216S illustrated in FIG. 6. The first thin layer 31 is made of, for example, molybdenum (Mo) or a compound thereof (metal), and has higher absorptance of light emitted from the organic layer 14 than the second thin layer. On the other hand, the second thin layer 32 has higher conductivity than the first thin layer 31, and is made of, for example, a simple substance or a compound of aluminum (Al), copper (Cu) or the like. The metal layers at the second level each include the first thin layer 31 having higher light absorptance above the second thin layer 32 made of aluminum or the like having high reflectivity (on a side closer to the first electrode layer 13), thereby unnecessary light such as outside light or light leaked from the organic light-emitting element 10 is allowed to be absorbed. In addition, in particular, the first thin layer 31 in the metal layer 216S is preferably made of a material of the same kind as that of a first conductive layer 131 (which will be described later) of the first electrode layer 13, because an effect of reducing connection resistance between the first electrode layer 13 and the metal layer 216S in the connection hole 124 is obtained. The third thin layer 33 functions so as to prevent a constituent element of the second thin layer 32 from spreading (moving) to the driving transistor Tr1 or the writing transistor Tr2 located below the second thin layer 32. For example, in the case where the second thin layer 32 includes an aluminum element, when heat is applied in a step after forming the metal layers at the second level, the aluminum element may be spread to the interior of a semiconductor thin film (for example, a thin film made of amorphous silicon) below the second thin layer 21 by thermal energy of the heat, thereby to form AlSi. In such a case, a spike may occur, so the third thin layer 33 is desirably made of, for example, titanium (Ti) or the like to prevent the spike. In addition, in the case where the second thin layer 32 is formed of an element which is resistant to heat diffusion, the metal layers at the second level may have a two-layer configuration including the first thin layer 31 and the second thin layer 32 (without arranging the third thin layer 33).

The whole pixel drive circuit 150 is covered with a protective film (passivation film) 217 made of silicon nitride or the like, and an insulating planarization film 218 is arranged on the protective film 217. It is desirable that a surface of the planarization film 218 has extremely high flatness. Moreover, a very thin connection hole 124 is arranged in a partial region of the planarization film 218 and a partial region of the protective film 217 (refer to FIGS. 5 and 8). In particular, the planarization film 218 has a larger thickness than the protective film 217, so the planarization film 218 is preferably made of a material having high pattern accuracy, for example, an organic material such as polyimide. The first electrode layer 13 fills in the connection hole 124 so as to be electrically connected to the metal layer 216S constituting the source electrode of the driving transistor Tr1.

The first electrode layer 13 formed on the planarization film 218 also functions as a reflective layer, and it is desirable that the first electrode layer 13 is made of a material having as high reflectivity as possible so as to improve light emission efficiency. Therefore, as illustrated in FIG. 6, the first electrode layer 13 has a two-layer configuration including a first conductive layer 131 and a second conductive layer 132, and the second conductive layer 132 located on a side facing the second electrode layer 16 is made of a material having high reflectivity such as aluminum (Al) or an aluminum-neodymium alloy (AlNd). In addition, aluminum has low resistance to a developing solution used in a developing process for forming the openings 24K of the opening specifying insulating film 24, and is prone to corrosion. On the other hand, AlNd has high resistance to the developing solution, and is resistant to corrosion. Therefore, the second conductive layer 132 may have a single-layer configuration made of AlNd or a two-layer configuration "Al layer (in a lower layer)/AlNd layer (in an upper layer)" including an aluminum layer and AlNd. In particular, the two-layer configuration of the Al layer (in the lower layer)/the AlNd layer (in the upper layer) is preferable, because the two-layer configuration has lower resistance than the single layer of the AlNd layer. On the other hand, the first conductive layer 131 is desirably made of a material having low reflectivity such as molybdenum (Mo) or a compound (an alloy) thereof, because a layer having high light absorptance is arranged on a side closer to the pixel drive circuit forming layer 112 in which the driving transistor Tr1 or the writing transistor Tr2 is arranged, thereby to absorb unnecessary light such as outside light or light leaked from the organic light-emitting element 10. Moreover, the whole thickness of the first electrode layer 13 is, for example, within a range from 100 nm to 1000 nm both inclusive, and the thickness of the first conductive layer 131 is 40 nm or over in the case where the first conductive layer 131 is made of a simple substance of molybdenum, and the thickness of the second conductive layer 132 is, for example, within a range from 300 nm to 500 nm in the case where the second conductive layer 132 is made of AlNd. In addition, as described above, the first electrode layer 13 is formed so as to cover the surface of the planarization film 218 and to fill in the connection hole 124.

The organic layer 14 is formed throughout a light emission region 20 specified by the opening specifying insulating film 24 without space. For example, as illustrated in FIG. 9, the organic layer 14 has a configuration in which a hole injection layer 14A, a hole transport layer 14B, the light-emitting layer 14C and an electron transport layer 14D are laminated in order from the first electrode layer 13. However, the layers except for the light-emitting layer 14C may be arranged as necessary.

The hole injection layer 14A is provided to enhance hole injection efficiency, and is a buffer layer for preventing leakage. The hole transport layer 14B is provided to enhance the hole transport efficiency to the light-emitting layer 14C. The light-emitting layer 14C emits light by the recombination of electrons and holes in response to the application of an electric field. The electron transport layer 14D is provided to enhance electron transport efficiency to the light-emitting layer 14C. In addition, an electron injection layer (not illustrated) made of LiF, $Li_2O$ or the like may be arranged between the electron transport layer 14D and the second electrode 16.

Moreover, the organic layer 14 has a different configuration depending on the color of light emitted from the organic light-emitting elements 10R, 10G or 10B. The hole injection layer 14A of the organic light-emitting element 10R has, for example, a thickness of 5 nm to 300 nm both inclusive, and is made of 4,4'4''-tris(3-methylphenylphenylamino)triphenylamine (m-MTDATA) or 4,4'4''-tris(2-naphthylphenylamino) triphenylamine (2-TNATA). The hole transport layer 14B of the organic light-emitting element 10R has, for example, a thickness of 5 nm to 300 nm both inclusive, and is made of bis[(N-naphthyl)-N-phenyl]benzidine (α-NPD). The light-emitting layer 14C of the organic light-emitting element 10R has, for example, a thickness of 10 nm to 100 nm both inclusive, and is made of an 8-quinolinol aluminum complex ($Alq_3$) mixed with 40 vol % of 2,6-bis[4-[N-(4-methoxyphenyl)-N-phenyl]amino styryl]naphthalene-1,5-dicarbonitrile (BSN-BCN). The electron transport layer 14D of the organic light-emitting element 10R has, for example, a thickness of 5 nm to 300 nm both inclusive, and is made of $Alq_3$.

The hole injection layer 14A of the organic light-emitting element 10G has, for example, a thickness of 5 nm to 300 nm both inclusive, and is made of m-MTDATA or 2-TNATA. The hole transport layer 14B of the organic light-emitting element 10G has, for example, a thickness of 5 nm to 300 nm both inclusive, and is made of α-NPD. The light-emitting layer 14C of the organic light-emitting element 10G has, for example, a thickness of 10 nm to 100 nm both inclusive, and is made of $Alq_3$ mixed with 3 vol % of Coumarin6. The electron transport layer 14D of the organic light-emitting element 10G has, for example, a thickness of 5 nm to 300 nm both inclusive, and is made of $Alq_3$.

The hole injection layer 14A of the organic light-emitting element 10B has, for example, a thickness of 5 nm to 300 nm both inclusive, and is made of m-MTDATA or 2-TNATA. The hole transport layer 14B of the organic light-emitting element 10B has, for example, a thickness of 5 nm to 300 nm both inclusive, and is made of α-NPD. The light-emitting layer 14C of the organic light-emitting element 10B has, for example, a thickness of 10 nm to 100 nm both inclusive, and is made of spiro6Φ. The electron transport layer 14D of the organic light-emitting element 10B has, for example, a thickness of 5 nm to 300 nm both inclusive, and is made of $Alq_3$.

The second electrode layer 16 has, for example, a thickness of 5 nm to 50 nm both inclusive, and is made of a simple substance or an alloy of a metal element such as aluminum (Al), magnesium (Mg), calcium (Ca) or sodium (Na). Among them, an alloy of magnesium and silver (an MgAg alloy) or an alloy of aluminum (Al) and lithium (Li) (an AlLi alloy) is preferable. For example, the second electrode layer 16 is commonly arranged for all of the organic light-emitting elements 10R, 10G and 10B, and is arranged so as to face the first electrode layers 13 of the organic light-emitting elements 10R, 10G and 10B. Moreover, the second electrode layer 16 is formed so as to cover not only the organic layers 14 but also the opening specifying insulating film 24.

The metal layer 17 is formed on the surface of the planarization film 218 as in the case of the first electrode layer 13, and functions so as to compensate for a voltage drop in the second electrode layer 16 as a main electrode. As illustrated in FIG. 10, the metal layer 17 has a two-layer configuration including a first conductive layer 171 and a second conductive layer 172. As described above, the metal layer 17 is covered with the second electrode layer 16 in the connection section 21 in the region of the opening 24K, and is electrically connected to the second electrode layer 16. In the metal layer 17 in the connection section 21, an end surface 172T of the second conductive layer 172 is recessed inward from an end surface 171T of the first conductive layer 171, thereby the metal layer 171 in the connection section 21 is formed so that a part of a top surface 171S of the first conductive layer 171 is formed so as to be in contact with the second conductive layer 17. In other words, the second electrode layer 16 is in contact with the end surface 171T and a part of the top surface 171S of the first conductive layer 171 and the end surface 172T and the top surface 172S of the second conductive layer 172.

It is desirable that the first conductive layer 171 and the second conductive layer 172 are made of a material having higher conductivity than the second electrode layer 16. Moreover, it is desirable that the first conductive layer 171 is made of a low-reflectivity material having high absorptance of light emitted from the organic layer 14, because as in the case of the first electrode layer 13, a layer with high light absorptance is arranged on a side closer to the pixel drive circuit forming layer 112 including the driving transistor Tr1 or the writing transistor Tr2, thereby to absorb unnecessary light such as outside light or light leaked from the organic light-emitting element 10. Moreover, it is desirable that one of the first conductive layer 171 and the second conductive layer 172 is made of a material which is resistant to degradation in quality such as surface oxidation and has favorable contact resistance to the second electrode layer 16. Further, to simplify manufacturing steps, it is desirable that the first conductive layer 171 and the second conductive layer 172 are made of the same materials as those of the first conductive layer 131 and the second conductive layer 132 constituting the first electrode layer 13, respectively. From the above-described viewpoints, as the material of the first conductive layer 171, a simple substance or a compound (an alloy) of molybdenum is suitable, and as the material of the second conductive layer 172, a simple substance or a compound (an alloy) of aluminum (Al) is suitable. In particular, it is desirable that molybdenum is used as the material of the first conductive layer 171, and AlNd as a material having a higher etching rate in a wet etching process than molybdenum is used as the material of the second conductive layer 172, because a two-layer configuration in which an end section in the metal layer 17 has a step-like shape as illustrated in FIG. 10 is allowed to be formed relatively easily. In addition, it is desirable that the metal layer 17 has as small a width (an area) as possible in terms of an improvement in aperture ratio.

In the case where the metal layer 17 is not present, due to a voltage drop according to a distance from a power source (not illustrated) to each of the organic light-emitting elements 10R, 10G and 10B, the potential of the second electrode layer 16 connected to the common power source line GND (refer to FIG. 2) is not uniform, thereby pronounced variations easily occur. Such variations in the potential of the second electrode layer 16 are not preferable, because the variations cause variations in luminance in the display region 110. Even in the case where a display has a larger screen, the metal layer 17 functions to prevent the occurrence of such variations in luminance by minimizing a voltage drop occurring from the power source to the second electrode layer 16.

In the organic light-emitting element 10, while the first electrode layer 13 fulfills a function as a reflective layer, the second electrode layer 16 fulfills a function as a semi-transparent reflective layer. Light emitted from the light-emitting layer 14C included in the organic layer 14 is multiply reflected by the first electrode layer 13 and the second electrode layer 16. In other words, the organic light-emitting element 10 has a resonator configuration in which an end surface on the organic layer 14 side of the first electrode layer 13, an end surface on the organic layer 14 side of the second electrode layer 16, and the organic layer 14 are considered as a first end section P1, a second end section P2, and an resonating section, respectively, and light generated in the light-emitting layer 14C is resonated to extract from the second end section P2. As the organic light-emitting element 10 has such a resonator configuration, light generated in the light-emitting layer 14C is multiply reflected, and the organic light-emitting element 10 functions as a kind of a narrow-band filter, thereby the half-value width of a spectrum of extracted light is allowed to be reduced, so color purity is allowed to be improved. Moreover, outside light entering from the sealing substrate 19 is allowed to be attenuated by multiple reflection, and by a combination of a retardation film or a polarizing plate (not illustrated), the reflectivity of the organic light-emitting element 10 for the outside light is allowed to be extremely small.

Figure 11:
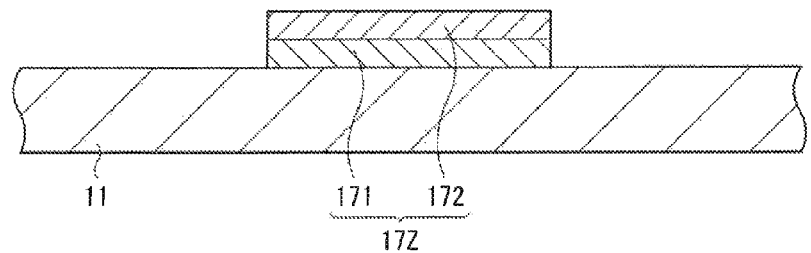
FIG. 11 is a sectional view illustrating one step for describing a method of manufacturing the display illustrated in FIG. 1.
Figure 12:
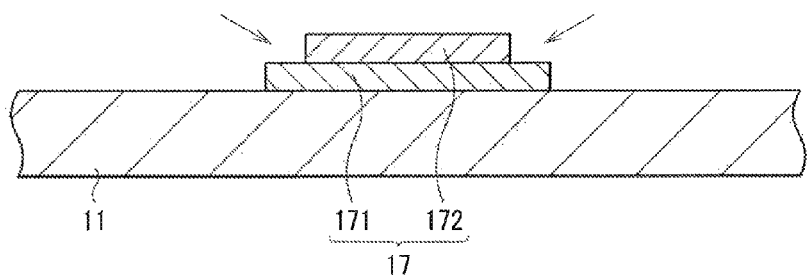
FIG. 12 is a sectional view illustrating one step following FIG. 11.
Figure 13:
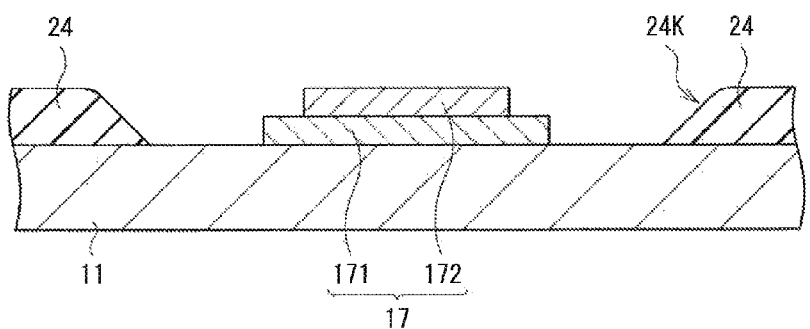
FIG. 13 is a sectional view illustrating one step following FIG. 12.

The display is manufacturable by, for example, the following steps. Referring to FIGS. 11 to 13 in addition to FIGS. 4 to 10, a method of manufacturing the display according to the embodiment will be described below.

First, the pixel drive circuit 150 including the driving transistor Tr1 and the writing transistor Tr2 is formed on the substrate 111 made of the above-described material. More specifically, first, a metal film is formed on the substrate 111 by, for example, sputtering. After that, the metal film is patterned by, for example, a photolithography method, dry etching or wet etching to form the metal layers 211G and 221G and the signal lines 120A. Next, the whole surface is covered with the insulating film 212. Moreover, the channel layers 213 and 223, the channel protective films 214 and 224, the drain electrodes 215D and 225D, the source electrodes 215S and 225S, the metal layers 216D and 226D and the metal layers 216S and 226S are formed in predetermined shapes in order on the gate insulating film 212. In this case, the scanning lines 130A and the power source lines 140A are formed as the second metal layers together with the formation of the metal layers 216D and 226D and the metal layers 216S and 226S. At this time, the connection section connecting between the metal layer 221G and the scanning line 130A, the connection section connecting between the metal layer 226D and the signal line 120A and the connection section connecting between the metal layer 226S and the metal layer 211G are formed in advance. After that, the whole surface is covered with the protective film 217 so as to complete the pixel drive circuit 150. At this time, an opening is formed in a predetermined position on the metal layer 216S in the protective film 217 by dry etching or the like.

After forming the pixel drive circuit 150, the whole surface is coated with, for example, a photosensitive resin mainly containing polyimide by a spin coating method or the like. Next, a photolithography process is performed on the photosensitive resin to form the planarization film 218 having the connection hole 124. More specifically, the connection hole 125 in communication with the opening arranged in the protective film 217 is formed by, for example, selective exposure to light and selective development using a mask having an opening in a predetermined position. After that, the planarization film 218 may be fired if necessary. Thereby, the pixel drive circuit forming layer 112 is obtained.

Moreover, the first electrode layer 13 and the metal layer 17 which are made of the above-described materials are formed. More specifically, the first conductive layers 131 and 171 and the first conductive layers 132 and 172 which are made of the above-described materials are formed on the whole surface by, for example, sputtering or the like so as to from a two-layer laminate film, and then a resist pattern (not illustrated) with a predetermined shape is formed on the laminate film through the use of a predetermined mask. Moreover, the laminate film is selectively etched using the resist pattern as a mask so as to form a laminate film pattern 17Z illustrated in FIG. 11. At this time, the first electrode layer 13 is formed so as to cover the surface of the planarization film 218 and to fill in the connection hole 124. Moreover, the laminate film pattern 17Z which will be the metal layer 17 in a later step is formed on the surface of the planarization film 218 so as to surround the first electrode layer 13. The laminate film pattern 17Z is desirably formed together with the first electrode layer 13 through the use of a material of the same kind as that of the first electrode layer 13.

Next, as illustrated in FIG. 12, a wet etching process is performed on the laminate film pattern 17Z with a predetermined etching solution, thereby the end surface 172T of the second conductive layer 172 with a relatively high etching rate is recessed, and the top surface 171S of the first conductive layer 171 is exposed. Thereby, the metal layer 17 is obtained. Alternatively, in the case where the first conductive layer 171 is made of molybdenum, the first conductive layer 171 and the second conductive layer may be exposed to light through the use of a halftone mask, and then wet etching or dry etching may be performed on them. Thereby, the metal layer 17 in which the end section has a step-like shape is obtained. Moreover, the opening specifying insulating film 24 is formed so as to fill in gaps between the first electrode layers 13 of the adjacent organic light-emitting elements 10. At this time, as illustrated in FIG. 13, the openings 24K are formed in positions corresponding to some intersections of the metal layer 17 patterned in a grid form.

Next, the hole injection layer 14A, the hole transport layer 14B, the light-emitting layer 14C and the electron transport layer 14D each of which is formed of the above-described material with the above-described thickness are laminated in order so as to thoroughly cover an exposed part of the first electrode layer 13, thereby the organic layer 14 is formed. Moreover, the second electrode layer 16 is formed on the whole surface so as to face the first electrode layer 13 with the organic layer 14 in between and to cover the metal layer 17 in the connection section 21, thereby the organic light-emitting element 10 is completed.

After that, the protective film 18 made of the above-described material is formed so as to cover the whole surface. Finally, an adhesive layer is formed on the protective film 18 so as to bond the sealing substrate 19 to the protective film 18 with the adhesive layer in between. Thus, the display is completed.

In the display obtained in such a manner, a scanning signal is supplied from the scanning line drive circuit 130 to each pixel through the gate electrode (the metal layer 221G) of the writing transistor Tr2, and an image signal from the signal line drive circuit 120 is retained in the retention capacitor Cs through the writing transistor Tr2. On the other hand, the power source line drive circuit 140 supplies the first potential higher than the second potential to each power source line 140A in synchronization with scanning on a line-by-line basis by the scanning line drive circuit 130. Thereby, the conduction state of the driving transistor Tr1 is selected, and a drive current Id is injected into each of the organic light-emitting elements 10R, 10G and 10B, thereby the each of the organic light-emitting elements 10R, 10G and 10B emits light by the recombination of electrons and holes. The light is multiply reflected between the first electrode layer 13 and the second electrode layer 16, and then passes through the second electrode 16, the protective film 18 and the sealing substrate 19 to be extracted.

As described above, in the embodiment, the metal layer 17 as the auxiliary wiring layer has a two-layer configuration in which the end section has a step-like shape in the connection section 21 with the second electrode layer 16, so a part of a film surface (a top surface) of the first conductive layer 171 is in contact with the second electrode layer 16. In this case, the first conductive layer 171 is made of a material which is resistant to degradation in quality such as surface oxidation and has favorable contact resistance to the second electrode layer 16. Therefore, even if the second conductive layer 172 is formed of a material which is prone to surface oxidation such as aluminum, favorable contact between the auxiliary wiring layer and the second electrode layer is secured without the influence of the material. As a result, uniformity of a light emission luminance distribution in a display screen is allowed to be improved, and higher display performance is obtainable.

Moreover, the first conductive layers 131 and 171 in the first electrode layer 13 and the metal layer 17 or the first thin layers 31 in the metal layers at the second level are made of a material with high light absorptance such as molybdenum, so unnecessary light such as outside light or light leaked from the organic light-emitting element 10 is allowed to be absorbed. In the case where the first conductive layers 131 and 171 or the first thin layers 31 are made of a material with high reflectivity such as aluminum, the above-described unnecessary light enters into the base 11 from a gap between the organic light-emitting element 10 and the metal layer 17. In this case, the unnecessary light directly enters into the channel regions 213R and 223R of the driving transistor Tr1 and the writing transistor Tr2, or the unnecessary light is repeatedly reflected from the back surfaces (surfaces on the base 11 side) of the first conductive layers 131 and 171 or surfaces of the first thin layers 31 to indirectly enter into the channel regions 213R and 223R. However, in the embodiment, because of the above-described reason, the entry of such unnecessary light into the channel regions 213R and 223R of the driving transistor TR1 and the writing transistor Tr2 or the like is preventable. As a result, the generation of a leakage current to the pixel drive circuit 150 due to a malfunction in the driving transistor Tr1 or the writing transistor Tr2 is reliably preventable, and image quality is allowed to be improved. Moreover, a reduction in the life of the driving transistor Tr1 or the writing transistor Tr2 is preventable, and operation reliability is allowed to be improved. In particular, when the first conductive layer 131 and the first conductive layer 171 are collectively formed of the same material, and the second conductive layer 131 and the second conductive layer 172 are collectively formed of the same material, the manufacturing steps are allowed to be simplified. At this time, even in the case where the second conductive layers 132 and 172 are formed using aluminum or an alloy of aluminum which is suitable for the second conductive layer 132, because of the above-described reason, favorable contact between the auxiliary wiring layer (the metal layer 17) and the second electrode layer is allowed to be secured, so display performance is not impaired.

Although the present invention is described referring to the above-described embodiment, the invention is not limited thereto, and may be variously modified. For example, in the above-described embodiment, the metal layer 17 has a step-like end section only in the connection section 21 in the opening 24K, and is connected to the second electrode layer 16, but the invention is not limited thereto. For example, the metal layer 17 may have a step-like two-layer configuration as a whole, and the metal layer 17 may be in contact with the second electrode layer 16 as a whole. Moreover, the configuration of the auxiliary wiring layer (the metal layer 17) is not limited to a two-layer configuration, and may be a multilayer configuration including three or more layers. An example of a three-layer configuration is a configuration in which a molybdenum layer, an aluminum layer and an AlNd layer are laminated in order from a base. Moreover, the planar shape of the metal layer 17 is not limited to a grid-like shape. For example, in FIG. 3, the metal layer 17 may extend in only one of an X direction and a Y direction.

Moreover, the materials and the laminating order of layers, a method of forming a film and the like are not limited to those in the above-described embodiment. For example, in the above-described embodiment, the case where the first electrode layer 13 and the second electrode layer 16 function as the anode and the cathode, respectively, is described. However, the first electrode layer 13 and the second electrode layer 16 may function as the cathode and the anode, respectively. Further, in the above-described embodiment, the configurations of the organic light-emitting elements 10R, 10G and 10B are specifically described. However, all layers are not necessarily included, or any other layer may be further included. For example, a thin film for hole injection made of chromium (III) oxide ($Cr_2O_3$), ITO (Indium-Tin oxide: a mixed oxide film of indium (In) and tin (Sn)) or the like may be included between the first electrode layer 13 and the organic layer 14.

In addition, in the above-described embodiment, the case where the second electrode layer 16 is configured of a semi-transparent reflective layer is described. However, the second electrode layer 16 may have a configuration in which a semi-transparent reflective layer and a transparent electrode are laminated in order from the first electrode layer 13. The transparent electrode is provided to reduce electrical resistance of the semi-transparent reflective layer, and is made of a conductive material having sufficient light transmittance for light generated in the light-emitting layer. As the material of the transparent electrode, for example, ITO or a compound including indium, zinc (Zn) and oxygen is preferable, because even if a film is formed at room temperature, favorable conductivity is obtainable. The thickness of the transparent electrode may be, for example, 30 nm to 1000 nm both inclusive. Moreover, in this case, a resonator configuration in which the semi-transparent reflective layer is considered as one end section and the other end section is arranged in a position facing the semi-transparent electrode with the transparent electrode in between so that the transparent electrode forms a resonating section may be formed. Moreover, in addition to arranging such a resonator configuration, it is preferable that the organic light-emitting elements 10R, 10G and 10B are covered with the protective film 18, and the protective film 18 is made of a material having a refractive index approximately equal to that of the material of the transparent electrode, because the protective film 18 is applicable as a part of the resonating section.

In the above-described embodiment, an active matrix display is described. However, the present invention is applicable to a passive matrix display. Moreover, the configuration of a pixel drive circuit for active matrix drive is not limited to that described in the above-described embodiment, and a capacitive element or a transistor may be added if necessary. In this case, depending on a change in the pixel drive circuit, a necessary drive circuit may be added in addition to the above-described signal line drive circuit 120 and the above-described scanning line drive circuit 130.

In the invention, in the auxiliary wiring layer, the first conductive layer at a lower level may be formed of titanium (Ti), and the second conductive layer at an upper level may be formed of AlNd. In this case, wet etching is performed on the second conductive layer made of AlNd through the use of a mixture of phosphoric acid, nitric acid and acetic acid, and then dry etching is performed on the first conductive layer made of titanium through the use of a chlorine-based gas, thereby a step-like configuration illustrated in FIG. 10, that is, a configuration in which the width of the first conductive layer is larger than the width of the second conductive layer may be formed.

The present application contains subject matter related to that disclosed in Japanese Priority Patent Application JP 2009-091292 filed in the Japan Patent Office on Apr. 3, 2009, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A display comprising:
   a light-emitting element comprised of (i) a first electrode, (ii) an organic layer including a light-emitting layer, and (iii) a second electrode in this order on a base;
   an insulating film disposed between the first electrode, and the second electrode, the insulating film having a plurality of openings arranged therein outside of an emissive region of the light emitting element; and
   a wiring within a region of each opening,
   wherein,
      the wiring has a first conductive layer and a second conductive layer,
      the wiring surrounding the organic layer in a plane view, and
      a part of a top surface of the first conductive layer is in contact with the second electrode via the openings.

2. The display according to claim 1, wherein the first electrode has a third conductive layer and a fourth conductive layer made of the same material as those of the first conductive layer and the second conductive layer, respectively, and the fourth conductive layer has higher reflectivity for light from the organic layer than the third conductive layer.

3. The display according to claim 1, wherein the second conductive layer is made of a material with a higher etching rate in a wet etching process than that of the first conductive layer.

4. The display according to claim 1, wherein the second electrode is in contact with an end surface of the first conductive layer and a top surface and an end surface of the second conductive layer in the wiring.

\* \* \* \* \*